(12) United States Patent
Opris

(10) Patent No.: US 7,209,008 B2
(45) Date of Patent: Apr. 24, 2007

(54) MULTIPLE OUTPUT PHASE-LOCKED LOOP (PLL) USING A SINGLE VOLTAGE CONTROLLED OSCILLATOR (VCO)

(75) Inventor: Ion E. Opris, San Jose, CA (US)

(73) Assignee: ForteMedia Inc., Cupertino, CA (US)

( * ) Notice: Subject to any disclaimer, the term of this patent is extended or adjusted under 35 U.S.C. 154(b) by 130 days.

(21) Appl. No.: 11/115,023

(22) Filed: Apr. 25, 2005

(65) Prior Publication Data
US 2006/0238262 A1    Oct. 26, 2006

(51) Int. Cl.
*H03L 7/07* (2006.01)
*H03L 7/081* (2006.01)

(52) U.S. Cl. .............. 331/12; 331/1 A; 331/11

(58) Field of Classification Search .............. 331/1 A, 331/11, 12, 45, 51, 55, 57, 74, DIG. 2; 327/141, 327/147, 151
See application file for complete search history.

(56) References Cited

U.S. PATENT DOCUMENTS

| | | | | |
|---|---|---|---|---|
| 5,059,924 A | * | 10/1991 | JenningsCheck | 331/1 A |
| 5,063,937 A | * | 11/1991 | Ezenwa et al. | 600/536 |
| 5,548,251 A | * | 8/1996 | Chou et al. | 331/57 |
| 6,351,165 B1 | * | 2/2002 | Gregorian et al. | 327/156 |
| 2001/0006356 A1 | * | 7/2001 | Norskov et al. | 331/34 |
| 2003/0214335 A1 | * | 11/2003 | Saeki | 327/165 |

* cited by examiner

*Primary Examiner*—Robert Pascal
*Assistant Examiner*—Ryan Johnson
(74) *Attorney, Agent, or Firm*—Perkins Coie LLP (57) ABSTRACT

Phase-locked loop (PLL) methods and apparatus are described for generating multiple output clocks synchronized to different frequencies of multiple input signals, wherein the multiple-output PLL employs a single voltage controlled oscillator (VCO). In an embodiment, the base module generates signals with a controlled frequency, multiple equidistant phase, and reduced duty cycles. Frequency dividers using barrel-shifters driven by an early-late detector combined with a left/right "one hot" shift-register or driven by an early-late detector combined with up-down counter/decoder are also disclosed.

15 Claims, 5 Drawing Sheets

MULTIPLE OUTPUT PHASE-LOCKED LOOP (PLL) USING A SINGLE VOLTAGE CONTROLLED OSCILLATOR (VCO)

TECHNICAL FIELD

The present invention relates to a phase-locked loop (PLL) circuit whereby a receiver locks (matches in phase) its local clock source to the received timing information of an incoming data stream.

BACKGROUND

In voice/audio digital processing, data streams may come from different sources that are not synchronized with the receiver clock. The frequency difference due to the differences between the remote and the local systems crystal oscillator frequencies is usually very small, such as 100 parts per million (ppm). One method of handling a frequency discrepancy is to use a voltage controlled crystal oscillator (VCXO) to lock the local system frequency to the remote system frequency. However, this technique is limited to a single received frequency and can not be used for multiple unrelated incoming data streams.

Further, in portable applications low power dissipation is also a major design constraint. Thus, it is ideal for a system with multiple arriving signals to have a single voltage controlled oscillator (VCO) operating at the least possible frequency.

DETAILED DESCRIPTION

The following description provides specific details of various embodiments for a thorough understanding and enablement. However, one skilled in the art will understand that the invention may be practiced without these details. In other instances, well-known structures and functions have not been shown or described in detail to avoid unnecessarily obscuring the description of the embodiments.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list.

Figure 1:
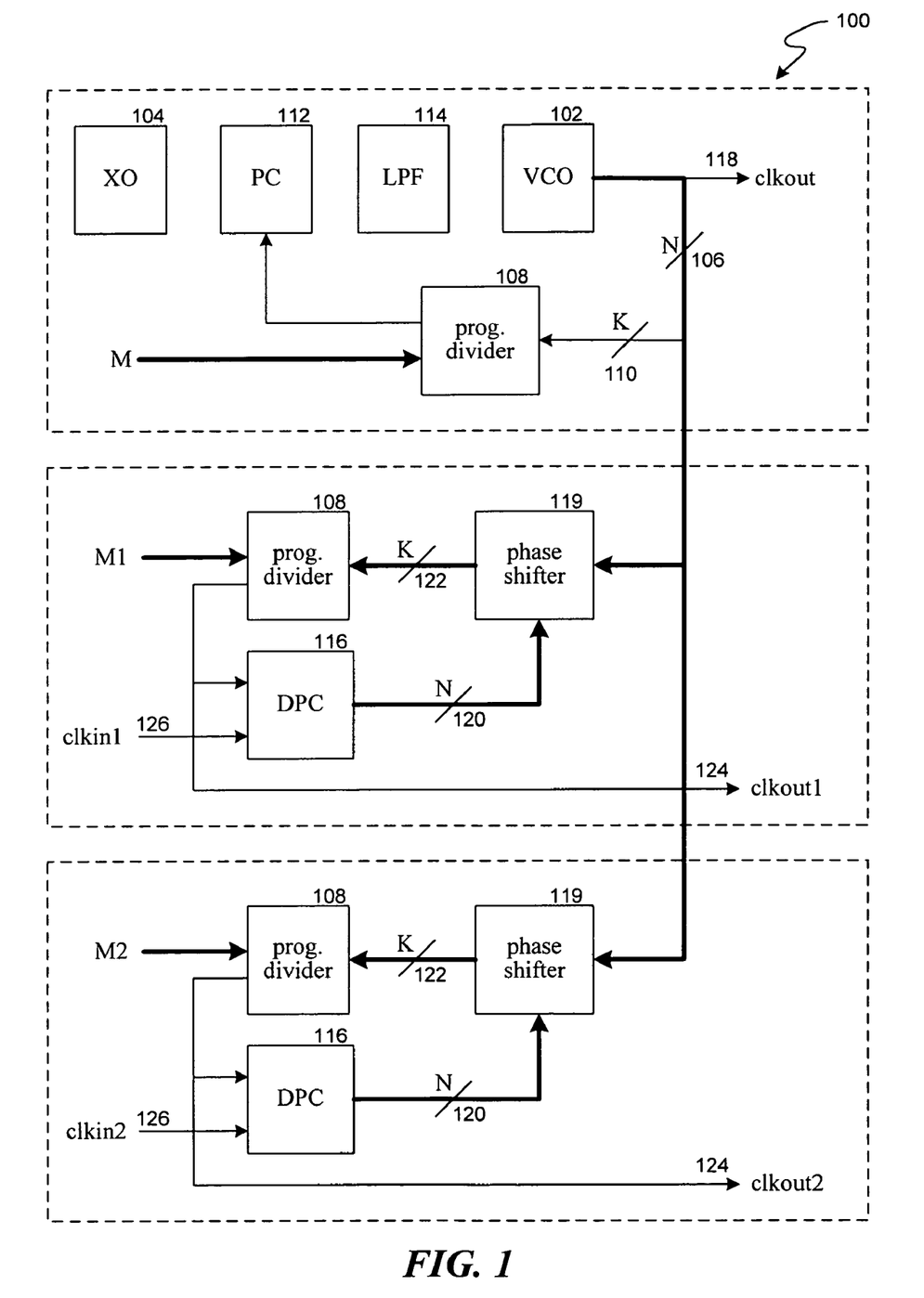
FIG. 1 is a schematic diagram of a multiple output PLL using a single voltage controlled oscillator (VCO), according to an embodiment of the invention.

FIG. 1 illustrates a multiple output PLL 100 using a single VCO 102 in its base module, wherein the VCO 102 has N outputs 106 of the same frequency but different phases. The base module of the PLL 100 also comprises a local crystal oscillator (XO) 104, a programmable divider 108 using K input signals 110 of differing phases selected from the N outputs 106 of the VCO, where, in one embodiment of the invention, K is an integer divider of N. The base module also includes a frequency/phase comparator (PC) 112 and a low pass filter (LPF) 114 in order to lock the output of the VCO 102 to the XO 104 frequency; however, the LPF 114 is not necessary for the working of the PLL.

The frequency/phase comparator 112 accepts two input signals from the local crystal oscillator 104 and the programmable divider 108. If both have the same phase and frequency the output of the frequency/phase comparator 112 will be zero, but if the input signals to the comparator 112 are out-of-phase, the output of the frequency/phase comparator 112 will be a signal, typically a voltage, proportional to the phase difference between these two inputs. This voltage output of the frequency/phase comparator 112 is then used to adjust the output of the VCO 102.

The programmable divider 108 of the base module produces an output frequency which is M/K times lower than its input frequency, where M is a control number provided to the divider 108. As a result, the clkout 118 of the base module, which is one of the N output phases 106 of the VCO, is locked in frequency to the local XO 104 and has a frequency of $M/K \cdot f_{xo}$, where $f_{xo}$ is the XO 104 frequency.

Each of the other modules of the PLL 100 comprises a programmable divider 108, a phase shifter 119, and a digital phase comparator (DPC) 116. The programmable divider 108 of other modules uses K of the N multiple phase signals 106, generated by the VCO 102, where the K signals are selected by the phase shifter 119 (e.g., a barrel-shifter) from the N signals 106, based on control signals 120. The control signals 120 are generated in a digital phase comparator 116, which monitors the phase/frequency difference between a locally generated clock signal 124, clkout, and an incoming clock signal 126, clkin.

The phase shifter 119 of the modules utilizes the N signals 106, as mentioned above, and N control inputs 120. The phase shifter 119 selects its K outputs 122 from its N inputs 106 according to the control inputs 120. In one embodiment, only one of the N control inputs 120 is active at one time, and that control indicates the amount of phase shifting in the phase shifter 119 as a result of the selection process. If the control inputs 120 do not change, there is a constant phase relationship between the input phases 106 and the output phases 122 in the phase shifter 119.

As further described below, if the control inputs 120 are continuously adjusted, the phases of the K outputs of the phase shifters 119 will "slip" with respect to their inputs, and therefore, their output frequencies will be slightly lower or higher than the VCO output frequency. As shown in FIG. 1, clkout1 and clkout2, 124, are internally generated clock outputs locked in frequency to clkin1 and clkin2, 126, respectively.

Figure 2:
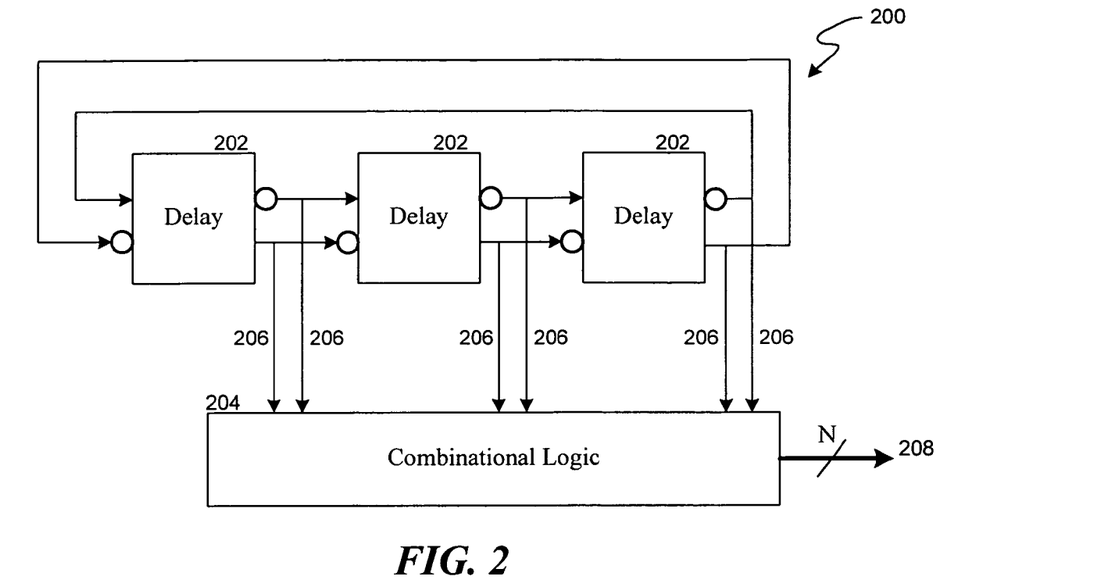
FIG. 2 illustrates an example of a multiple output VCO, according to another embodiment of the invention.

FIG. 2 illustrates an example of a multiple output VCO 200, which is based on a ring oscillator with differential delay cells 202. The N outputs 206 of the ring oscillator will have close to 50% duty cycle. However, in this embodiment, it is advantageous to use a combinational logic circuit 204 to combine the phases from the ring oscillator to generate N outputs 208 with a duty cycle significantly lower than 50%. For N=3, the duty factor can be ⅙, or about 16%.

Figure 3:
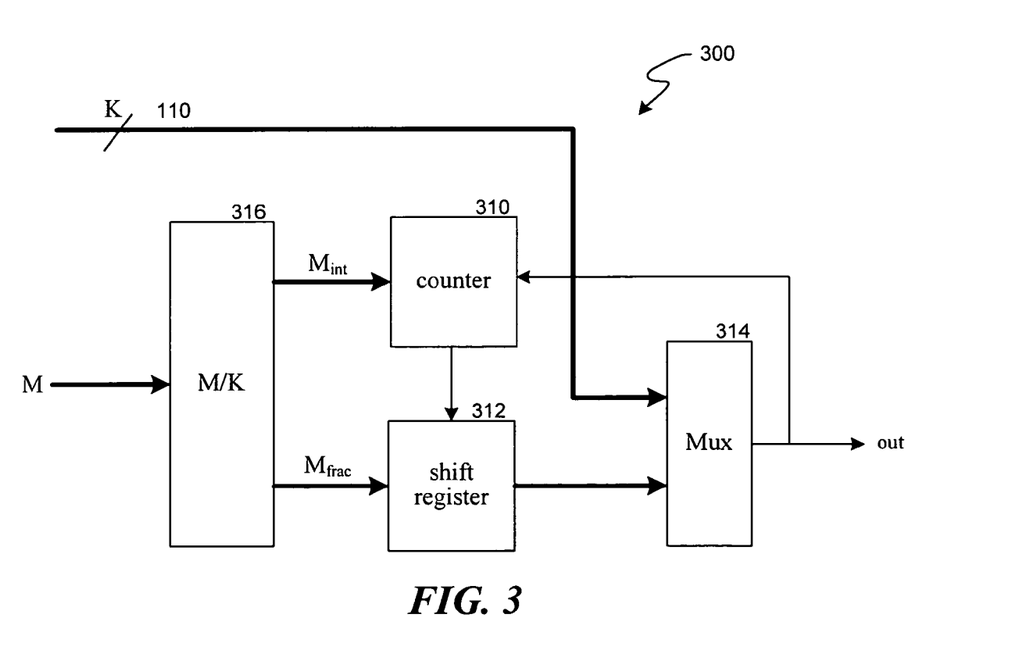
FIG. 3 schematically illustrates a programmable divider.

FIG. 3 is a schematic illustration of a programmable divider 300, in accordance with an embodiment of the invention. The programmable divider 300 takes advantage of the multiple phases of the signals 106 from the VCO 102. In one embodiment K equidistant phases 110 are employed and the divider setting is M. Considering the integer part of M/K as $M_{int}$, and the fractional part of M/K as $M_{frac}$, the divider 300 counts $M_{int}$ clock cycles on the same signal phase, using counter 310, and then shifts the output phase to another one of the K input lines that will correspond to $M_{frac}$ of a clock cycle change.

For the purpose of shifting, a shift register 312 controls multiplexer 314, based on both the counter 310 output and $M_{frac}$, and multiplexes out one of the K signals 110. Since the M setting is static, the division M/K to extract $M_{int}$ and $M_{frac}$ can be done very slowly in a division module 316 and does not need any dynamic power during the normal operation of the PLL. FIG. 3 illustrates a general case. In other embodiments where M/K is an integer, a single output line is sufficient to go from the phase shifter 119 to the programmable divider 108.

Figure 4:
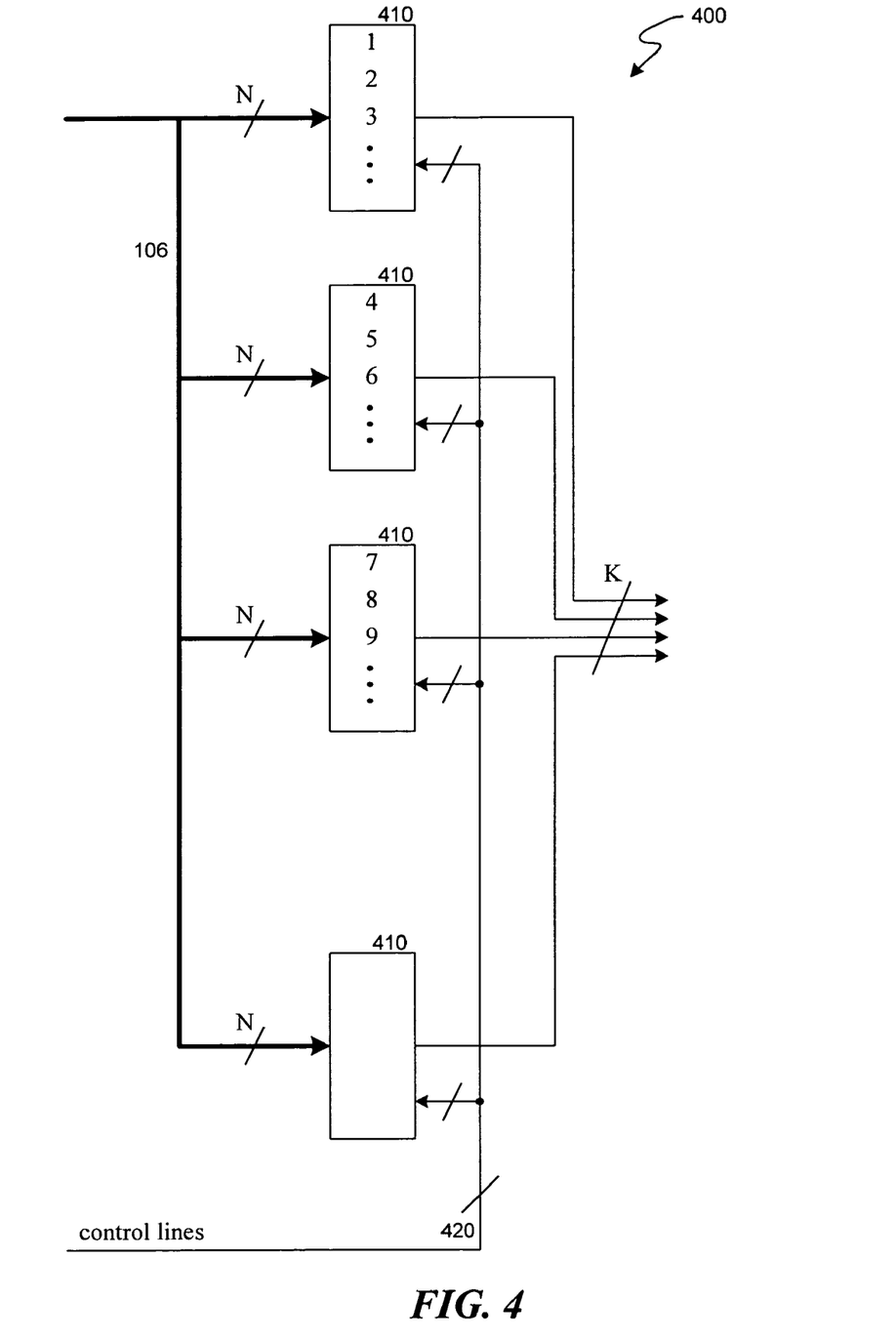
FIG. 4 depicts a phase shifter implemented with K multiplexers, each with N inputs.

FIG. 4 illustrates a phase shifter 400 implemented with K multiplexers (Mux) 410, each with N inputs 106. For each Mux 410, the input lines 106 are shifted by N/K, such that K equidistant phases are outputted for any control/select input 420. FIG. 4 shows an example of an input arrangement to the multiplexers 410, where the same control to the multiplexers 410 causes their outputs to represent every third phase of the N input phases 106.

Figure 5:
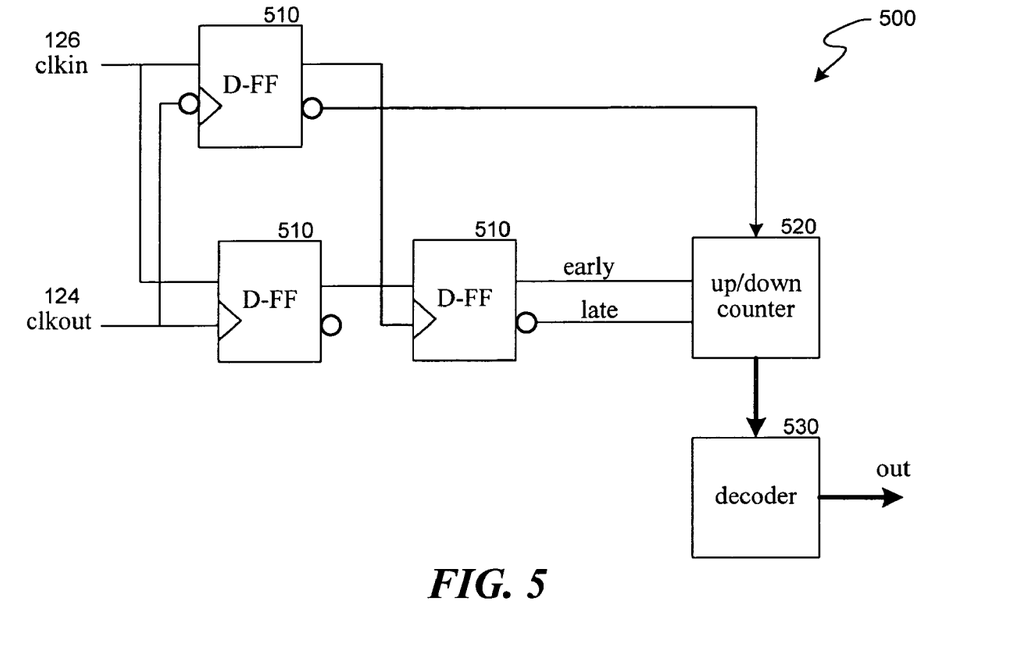
FIG. 5 illustrates an implementation of a digital phase comparator (DPC) based on an "early-late" detector and an up-down counter, in accordance with an embodiment of the invention.
Figure 6:
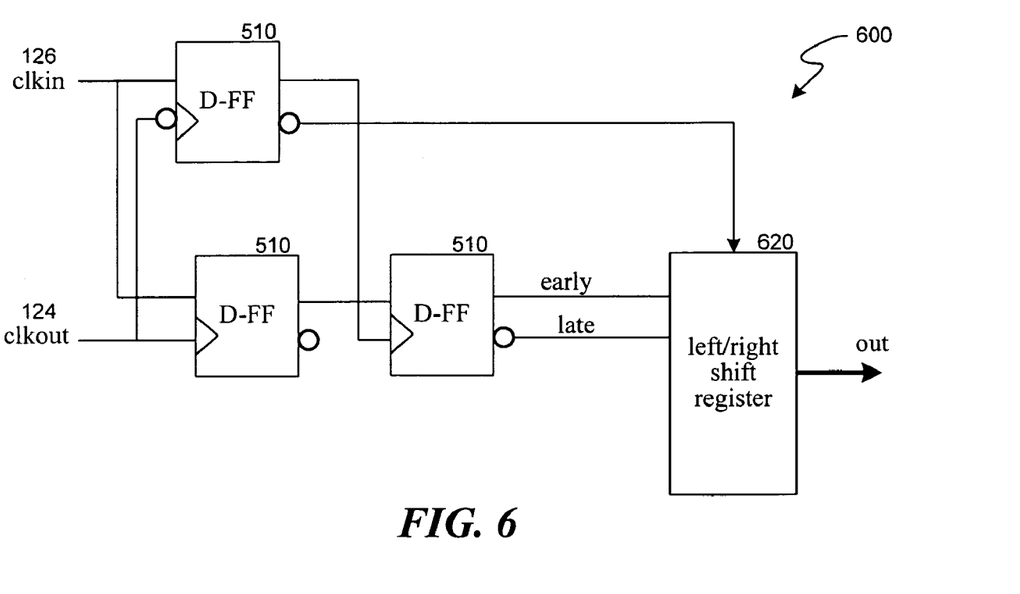
FIG. 6 illustrates another digital phase comparator (DPC) implemented by a shift-register that shifts right or left based on an early-late decision.

FIG. 5 shows an implementation of a DPC 500, in accordance with an embodiment of the invention. This implementation is based on an "early-late" detector comprising D flip-flops 510 and an up-down counter 520 that increments and decrements its output based on an early-late decision. In this embodiment a "one-hot" decoder 530 decodes the counter 520 output. FIG. 6 depicts a similar arrangement as depicted in FIG. 5, wherein the up-down counter 520 and 530 are both replaced by a left/right shift register 620 that can shift either to the right or to the left based on the early-late decision.

The following is an example of a multiple output PLL using a single VCO, in accordance with another embodiment of the invention. In this example voice/audio data is sampled in a first system at 16K Sample/s using a first crystal clock of 4.096 MHz (1 sample per 256 clock pulses), and is sent to a second system, using a second crystal clock with a frequency of 4.0964 MHz; therefore, the received signal is about 100 ppm (parts per million) off.

If the receiving system clock is used to clock-in the incoming data stream directly, the base frequency difference of about 100 ppm will create an annoying low frequency disturbance, because for every 10,000 samples sent an extra sample needs to be inserted in the receiving system to keep up with the receiving system clock. It will greatly help to have the receiving clock synchronized to the incoming data clock with no frequency slippage.

In this example the PLL is similar to the one shown in FIG. 1, with N=6, an XO frequency of 4.0964 MHz, and a programmable divider using K=1, and a divider number of M=64. Thus, the nominal output clock frequency of clkout would be $M \cdot f_{xo}$=4.0964·64 MHz or 262.17 MHz. After dividing it by 64 and 256, the sample rate will be 16.00156 KHz, and will be off, with respect to the incoming data rate of 16 KHz, by about 100 ppm. Assuming that the VCO is locked to the XO frequency, it outputs 6 phases at 262.17 MHz, and each phase is 1/(6·262.17 MHz)=635 ps (picosecond, $10^{-12}$ seconds) apart. The phase shifter receives the 6 phases, each 635 ps apart, and outputs one output clock.

Figure 7:
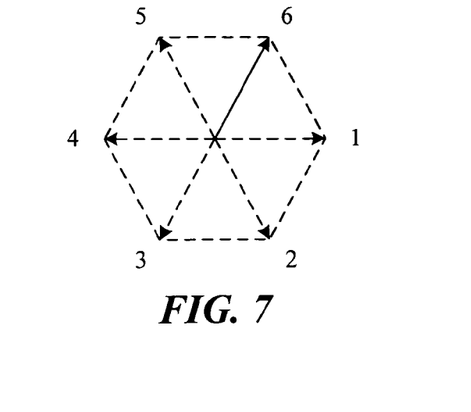
FIG. 7 schematically illustrates output phases of a VCO with one phase selected as an output clock from a barrel-shifter.

FIG. 7 represents the phases generated by VCO, with one phase selected as the output clock from the phase shifter. If the phase shifter control does not change, the output clock of the phase shifter has the same frequency as the VCO clock, since the phase difference between the phase shifter output and the VCO output phases remains constant. However, if the phase shifter selection changes periodically, such as every Q cycles, as in FIG. 8 (6→5→4→3→2→1→6, etc.), the phase difference between the VCO output and the phase shifter output changes periodically, with a period of 6Q cycles. That is, after 6Q cycles, the phase difference comes back to where it started; however, the total number of cycles of the phase shifter output is one less than the number of cycles of the VCO output. This is because the total phase shift iduring the VCO cycles was 6Q·360°, whereas the total phase shift during the same time in the phase shifter output was only (6Q−1)·360°. The frequency of the phase shifter output is therefore slightly off form the VCO output frequency by a ratio of (6Q−1)/6Q.

Figure 8:
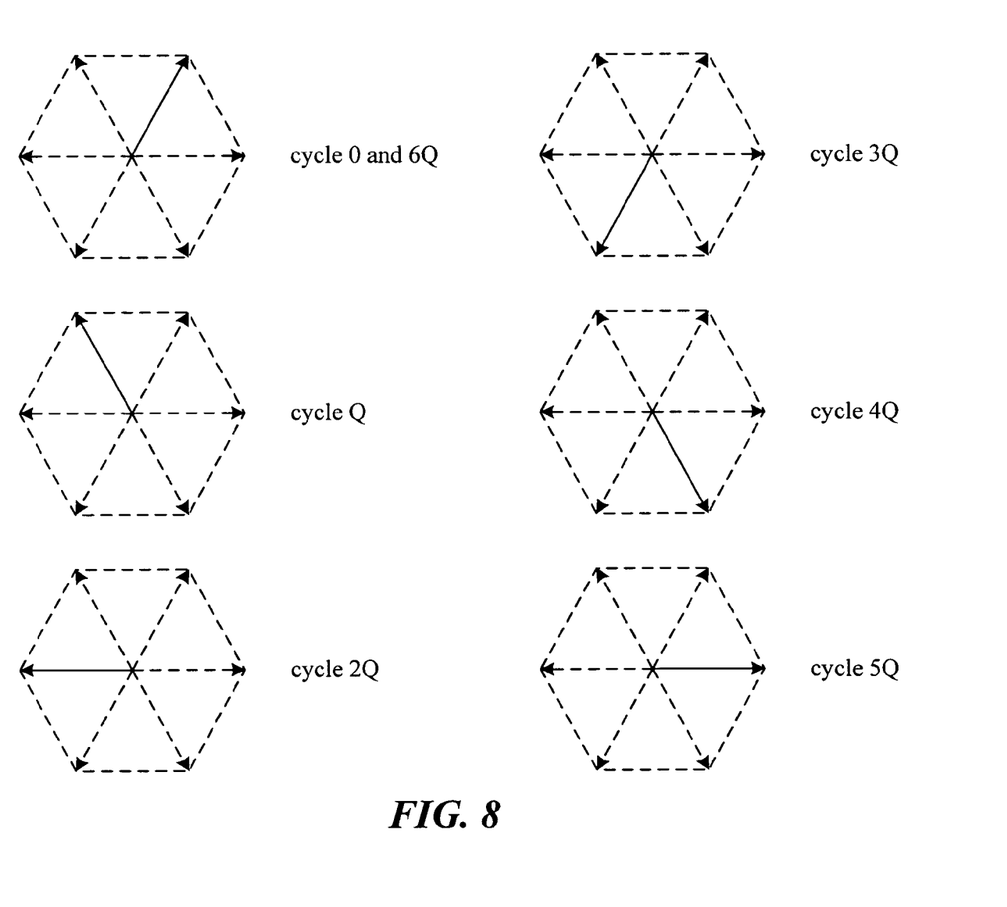
FIG. 8 shows a periodically changing barrel-shifter output and corresponding periodic phase shift between the VCO output and the barrel shifter output.

Moving the selection of the phase shifter periodically in the opposite direction (6→1→2→3→4→5→6, etc.) introduces more total phase change in the phase shifter output than in the VCO output, so the frequency at the output of the phase shifter is increased by a ratio of (6Q+1)/6Q. Since Q can be made arbitrarily large (driven by a digital state machine), the frequency difference between the VCO output frequency and the phase shifter output frequency can be made arbitrarily small. A digital phase comparator can actually drive the phase shifter selection such that the outputs of the programmable dividers remain in sync with the input data clock.

In order to track the input frequency shift versus the local crystal, the phase shifter selection has to change rapidly. As in this example, the maximum output frequency range is between (6Q−1)/6Q and (6Q+1)/6Q, where Q is the number of VCO cycles after which a new selection can be made. In tracking an input clock, it is reasonable to make a selection only after a phase comparison between the input clock and an output clkout1 clock, using an early-late detector. This limits the locking range by limiting the minimum number Q to $f_{vco}/f_{clkin1}$, where $f_{vco}$ is the VCO frequency and $f_{clkin1}$ is the clkin1 frequency.

In other embodiments more complicated prediction algorithms may be used to predict higher phase shifts and increase the locking range. In this example, using a clkin1 of 256 KHz (16 $f_s$), Q is 1025 and the maximum locking range is about 0.99984 to 1.00016 from the VCO frequency (+1−160 ppm).

This limitation on locking range can be simply expressed in terms of the maximum jitter allowed and the input reference clock clkin1. The relative frequency shift can be expressed as ⅙Q or $f_{clkin1}/(6 \cdot f_{vco})$, where $1/(6 \cdot f_{vco})$ is the time shift when the phase shifter jumps form a phase to another. In this example this time shift limits the output jitter of the digital PLL (neglecting other random jitter) to 635 ps, which is adequate even for audio quality and definitely for voice quality. Hence, the maximum relative locking range is:

(Data stream clock frequency)/(Maximum allowable jitter).

This relation is independent of the particular VCO frequency used, or the number of Q-phases selected for the design. However, the VCO frequency and the number of phases have to satisfy the maximum jitter requirement $1/(Q \cdot f_{vco}) <$ maximum allowable jitter.

It is to be noted that it is not necessary for Q to be a fixed number in consequent selection cycles; rather, Q represents the number of cycles after which a decision is made for performing a phase shift by shifting to another output signal of the VCO. It is also to be noted that in consequent selection cycles, as mentioned above, a phase shift may be either in an opposite direction of a previous phase shift or in the same direction as the previous shift. In other words, with reference to FIG. 7, a phase shift may be clockwise or counter-clockwise. This flexibility provides, on the average, any desirable phase shift.

While specific circuitry may be employed to implement the above embodiments, some aspects can be implemented in a suitable computing environment. Although not required, some aspects may be implemented as computer-executable instructions, such as routines executed by a general-purpose computer, e.g., a server computer, wireless device or personal computer. Those skilled in the relevant art will appreciate that the embodiments can be practiced with other communications, data processing, or computer system configurations, including: Internet appliances, hand-held devices including personal digital assistants (PDAs), wearable computers, all manner of cellular or mobile phones, multi-processor systems, microprocessor-based or programmable consumer electronics, set-top boxes, network PCs, mini-computers, mainframe computers, and the like. Indeed, the terms "computer," "host," and "host computer" are generally used interchangeably herein, and refer to any of the above devices and systems, as well as any data processor.

Some aspects can be embodied in a special purpose computer or data processor that is specifically programmed, configured, or constructed to perform one or more of the processes explained in detail herein. Some aspects can also be practiced in distributed computing environments where tasks or modules are performed by remote processing devices, which are linked through a communications network, such as a Local Area Network (LAN), Wide Area Network (WAN), or the Internet. In a distributed computing environment, program modules may be located in both local and remote memory storage devices.

Some aspects may be stored or distributed on computer-readable media, including magnetically or optically readable computer discs, hard-wired or preprogrammed chips (e.g., EEPROM semiconductor chips), nanotechnology memory, biological memory, or other data storage media. Indeed, computer implemented instructions, data structures, screen displays, and other data may be distributed over the Internet or over other networks (including wireless networks), on a propagated signal on a propagation medium (e.g., an electromagnetic wave(s), a sound wave, etc.) over a period of time, or may be provided on any analog or digital network (packet switched, circuit switched, or other scheme). Those skilled in the relevant art will recognize that some portions can reside on a server computer, while corresponding portions reside on a client computer such as a mobile or portable device, and thus, while certain hardware platforms are described herein, some aspects are equally applicable to nodes on a network.

The above detailed description of the embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways.

Also, while processes or blocks are at times shown as being performed in series, these processes or blocks may instead be performed in parallel, or may be performed at different times. Where the context permits, words in the above Detailed Description using the singular or plural number may also include the plural or singular number respectively.

The teachings provided herein can be applied to other systems, not necessarily the system described herein. The elements and acts of the various embodiments described above can be combined to provide further embodiments. All patents and applications and other references, including any that may be listed in accompanying filing papers, are incorporated herein by reference. Aspects of the invention can be modified, if necessary, to employ the systems, functions, and concepts of the various references described above to provide yet further embodiments of the invention.

These and other changes can be made to the invention in light of the above Detailed Description. While the above description details certain embodiments of the invention and describes the best mode contemplated, no matter how detailed the above appears in text, the invention can be practiced in many ways. Details of the system may vary considerably in its implementation details, while still being encompassed by the invention disclosed herein.

Particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention.

All of the above patents and applications and other references, including any that may be listed in accompanying filing papers, are incorporated herein by reference. Aspects of the invention can be modified, if necessary, to employ the systems, functions, and concepts of the various references described above to provide yet further embodiments of the invention.

Changes can be made to the invention in light of the above "Detailed Description." While the above description details certain embodiments of the invention and describes the best mode contemplated, no matter how detailed the above appears in text, the invention can be practiced in many ways.

Therefore, implementation details may vary considerably while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated.

In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

I claim:

1. A phase-locked loop (PLL), utilizing a single voltage controlled oscillator (VCO), where the PLL is configured to lock multiple internal clocks to multiple incoming data signals of different frequencies, the PLL comprising:
    a base module generating N signals of same frequency and different phases, the base module further comprising:
        a base oscillator for generating a base frequency;
        a frequency/phase comparator for comparing phase and frequency of two input signals and generating an output signal proportional to differences of the input two signals;
        a voltage controlled oscillator (VCO) for generating N signals with a same frequency and differing phases, wherein the generated frequency is controlled by an output of the frequency/phase comparator; and
        a programmable divider for dividing a frequency of an input signal, based on a control number provided to the divider, wherein the divider receives K of the N controlled frequency signals; and
    at least one synchronizing module for locking an internal clock frequency to an incoming signal frequency, the synchronizing module including:
        a phase shifter for shifting shifter inputs and providing a shifted phase output at a shifter output, wherein the shifter receives N controlled frequency signals from the base module as input signals, and receives a control signals from a digital frequency/phase comparator (DPC);
        a programmable divider configured to divide an input frequency received from the phase shifter, using a provided control number, and output the divided frequency; and
        a digital frequency/phase comparator (DPC) for comparing the programmable divider output with an incoming signal and for generating control signals based on frequency and phase differences of the two compared signals, wherein the control signals are used to control the phase shifter;
    wherein the phase shifter makes a phase-shift selection every Q cycles, which causes an output frequency of the phase shifter to be controllably off with respect to the VCO output frequency, and wherein:

Q may change for every selection:
    a positive or a negative frequency offset is controlled by the shifting direction; and
    a large Q makes a frequency difference between the VCO output frequency and the shifter output frequency correspondingly small.

2. The PLL of claim 1, wherein a set of the VCO generated signals are inputted to each phase shifter and a subset of the inputted signals is outputted from the phase shifter, based on the control signals.

3. The PLL of claim 1, wherein: the VCO comprises a ring oscillator with differential delay cells and a combinational logic circuit;
    the N outputs of the ring oscillator have close to 50% duty cycle; and the combinational logic circuit combines phases from the ring oscillator to generate outputs with duty cycles substantially lower than 50%.

4. The PLL of claim 1, wherein the programmable divider of a synchronizing module employs K equidistant phases from the VCO outputs and receives a control number M, where the integer part of M/K is $M_{int}$ and the fractional part of M/K is $M_{frac}$, and wherein the programmable divider counts $M_{int}$ input clocks on a same input phase to implement division by $M_{int}$ and subsequently shifts the phase to implement division by $M_{frac}$.

5. The PLL of claim 1, wherein the phase shifter is a barrel-shifter or the phase shifter is implemented with K N-input multiplexers, and wherein the N input lines to each multiplexer are shifted by N/K such that for any control input K equidistant phases are outputted from the K multiplexers.

6. The PLL of claim 1, wherein the DPC comprises:
    an early-late detector and an up-down counter that increments and decrements the detector output based on an early-late decision; or
    an early-late detector and a right-left one-hot shift register that shifts either to the right or to the left based on the early-late decision.

7. A phase-locked loop (PLL), utilizing a single voltaae controlled oscillator (VCO), where the PLL is configured to lock multiple internal clocks to multiple incoming data signals of different freguencies, the PLL comprising:
    a base module generating N signals of same freguency and different phases, the base module further comprising:
        a base oscillator for generating a base freguency;
        a frequency/phase comparator for comparing phase and freguency of two input signals and generating an output signal proportional to differences of the input two signals;
        a voltage controlled oscillator (VCO) for generating N signals with a same frequency and differing phases, wherein the aenerated frequency is controlled by an output of the frequency/phase comparator; and
        a programmable divider for dividing a frequency of an input signal, based on a control number provided to the divider, wherein the divider receives K of the N controlled frequency signals; and
    at least one synchronizing module for locking an internal clock frequency to an incoming signal frequency, the synchronizing module including:
        a phase shifter for shifting shifter inputs and providing a shifted phase output at a shifter output, wherein the shifter receives N controlled frequency signals from the base module as input signals, and receives a control signals from a digital frequency/phase comparator (DPC);

a programmable divider configured to divide an input freauency received from the phase shifter, using a provided control number, and output the divided frequency; and a digital frequency/phase comparator (DPC) for comparing the programmable divider output with an incoming signal and for generating control signals based on frequency and phase differences of the two compared signals, wherein the control signals are used to control the phase shifter, wherein:

for tracking an incoming signal frequency, clkin, a phase-shift selection is made after a frequency/phase comparison between clkin and an output clock, clkout, using an early-late detector, which limits a locking range by limiting a minimum number of Q cycles to $f_{vco}/f_{clkin}$, where $f_{vco}$ is the VCO frequency and $f_{clkin}$ is the clkin frequency; and a maximum relative locking range is:

(cikin )/(maximum allowable jitter), which is independent of the VCO frequency or number of Q-phases selected, and where a jitter occurs when the shifter jumps form a phase to another; and the VCO frequency and the number of phases have to satisfy the maximum jitter requirement:

$1/(Q*f_{vco})<$maximum allowable jitter.

8. A phase-locked loop (PLL) method of using a single base frequency to synchronize phases and frequencies of multiple internally generated clock signals with phases and frequencies of multiple arriving signals, the method comprising:

generating multiple base signals having the base frequency and multiple different phases; and locking at least one internal clock frequency to an incoming signal frequency and outputting the locked internal clock, the locking process comprising:

selecting a subset of the base signals based on a set of control signals generated by a phase comparison process;

generating a signal with a frequency and phase substantially equal to the frequency and phase of an arriving signal using the selected base signals and a provided control number; and producing control signals to control the selection of the base signals by comparing the frequency and phase of the generated signal with the frequency and phase of the arriving signal, wherein for tracking an arriving signal frequency, clkin, a selection is made after a phase comparison between clkin and an internally generated clock, clkout, using early-late detection, which limits a locking range by limiting a minimum number Q to $f_{vco}/f_{clkin}$, where $f_{vco}$ is the base frequency and $f_{clkin}$ is the $_{clkin}$ frequency; and a maximum relative locking range is:

(clkin)/(maximum allowable jitter), which is independent of the base freguency or number of Q-phases selected, and where a jitter occurs when the selection jumps form a phase to another; and the base freuency and the number of phases have to satisfy the maximum utter reguirement:

$1/(Q*f_{vco})<$maximum allowable jitter.

9. The method of claim 8, wherein the subset of the base signals are selected from a complete set of the base signals based on the control signals.

10. The method of claim 8, wherein the base signals are produced by a ring oscillator with differential delay cells and a combinational logic circuit, and wherein:

outputs of the ring oscillator have close to 50% duty cycle; and the combinational logic circuit combines phases from the ring oscillator to generate outputs with duty cycles substantially lower than 50%.

11. The method of claim 8, wherein selecting the subset of the base signals is implemented with K multiplexers, each with N inputs, and wherein for each multiplexer input lines are shifted by N/K, such that K equidistant phases are outputted for any common control input to the multiplexers.

12. The method of claim 8, wherein comparing the frequency and phase of the generated signal with the frequency and phase of the arriving signal comprises:

early-late detection and an up-down counting processes that increments and decrements the detector output based on an early-late decision; or early-late detection and right-left one-hot shifting processes that shifts either to the right or to the left based on the early-late decision.

13. The method of claim 8, wherein the base signal generation comprises: producing a first reference signal having a first frequency;

comparing the first reference signal with a second reference signal having a second frequency and forming an output signal related to the differences of the first and second signals;

generating multiple differing phase signals with a single frequency that is a controlled multiple of the first frequency, wherein the frequency of the generated signals is controlled by the comparison output; and wherein the second reference signal is produced by dividing the frequency of the generated signals, using a provided number and a subset of the generated signals.

14. A phase-locked loon (PLL) method of using a single base freauency to synchronize phases and freguencies of multiple internally generated clock signals with phases and freguencies of multiple arriving signals, the method comprising:

generating multiple base signals having the base freauency and multiple different phases; and locking at least one internal clock frequency to an incoming signal freguency and outputting the locked internal clock, the locking process comprising:

selecting a subset of the base signals based on a set of control signals generated by a phase comparison process;

generating a signal with a frequency and phase substantially equal to the freguency and phase of an arriving signal using the selected base signals and a provided control number; and producing control signals to control the selection of the base signals by comparing the freguency and phase of the generated signal with the freauency and phase of the arriving signal, wherein selecting a subset of the base signals is accomplished by shifting from a subset of the base signals to another, based on the control signals and the selection is changed every Q cycles, which causes the frequency of the generated signal to be controllably off with respect to the base frequency, and wherein:

Q may change for every selection;

a positive or a negative frequency offset is controlled by the shifting direction; and a large Q makes a difference between the base frequency and the generated signal frequency correspondingly small.

15. A phase-locked loon (PLL) method of using a single base frequency to synchronize phases and freguencies of multiple internally generated clock signals with phases and freguencies of multiple arriving signals, the method comprising:
generating multiple base signals having the base frequency and multiple different phases; and
locking at least one internal clock frequency to an incoming signal frequency and outputting the locked internal clock, the locking process comprising:
selecting a subset of the base signals based on a set of control signals generated by a phase comparison process;
generating a signal with a frequency and phase substantially equal to the frequency and phase of an arriving signal using the selected base signals and a provided control number; and
producing control signals to control the selection of the base signals by comparing the frequency and phase of the generated signal with the frequency and phase of the arriving signal,
wherein generating a signal with a frequency and phase substantially equal to the frequency and phase of an arriving signal comprises programmably dividing the base frequency by using a subset of the base signals with K equidistant phases and a provided control number M, where the integer part of M/K is $M_{int}$ and the fractional part of M/K is $M_{frac}$, and wherein the programmably dividing the base frequency further comprises counting $M_{int}$ cycles on a same signal phase to implement division by $M_{int}$ and subsequently shifts the phase to implement division by $M_{frac}$.

* * * * *

UNITED STATES PATENT AND TRADEMARK OFFICE
CERTIFICATE OF CORRECTION

PATENT NO. : 7,209,008 B2
APPLICATION NO. : 11/115023
DATED : April 24, 2007
INVENTOR(S) : Opris It is certified that error appears in the above-identified patent and that said Letters Patent is hereby corrected as shown below:

In column 4, lines 10-11, delete "(picosecond, $10^{-12}$ seconds)" and insert -- (picosecond = $10^{-12}$ seconds) --, therefor.

In column 4, line 27, delete "iduring" and insert -- during --, therefor.

In column 7, line 67, in Claim 1, delete "freguency," and insert -- frequency, --, therefor.

In column 8, line 1, in Claim 1, after "selection" delete ":" and insert -- ; --, therefor.

In column 8, line 4, in Claim 1, delete "freguency" and insert -- frequency --, therefor.

In column 8, line 39, in Claim 7, delete "voltaae" and insert -- voltage -- therefor.

In column 8, line 42, in Claim 7, delete "freguencies," and insert -- frequencies, --, therefor.

In column 8, line 43, in Claim 7, delete "freguency" and insert -- frequency -- therefor.

In column 8, line 46, in Claim 7, delete "freguency;" and insert -- frequency; --, therefor.

In column 8, line 47, in Claim 7, delete "freguency/phase" and insert -- frequency/phase --, therefor.

In column 8, line 48, in Claim 7, delete "freguency" and insert -- frequency --, therefor.

In column 8, line 53, in Claim 7, delete "aenerated" and insert -- generated --, therefor.

In column 9, line 2, in Claim 7, delete "freauency" and insert -- frequency --, therefor.

In column 9, line 19, in Claim 7, delete "(cikin )" and insert -- (clkin) --, therefor.

In column 9, line 55, in Claim 8, after "the" delete "$_{clkin}$" and insert -- clkin --, therefor.

Signed and Sealed this

Twenty-first Day of September, 2010

David J. Kappos
*Director of the United States Patent and Trademark Office*

CERTIFICATE OF CORRECTION (continued)
U.S. Pat. No. 7,209,008 B2

In column 9, line 58, in Claim 8, delete "freguency" and insert -- frequency --, therefor.

In column 9, line 61, in Claim 8, delete "freauency" and insert -- frequency --, therefor.

In column 9, line 62, in Claim 8, delete "utter reguirement:" and insert -- jitter requirement: --, therefor.

In column 10, line 37, in Claim 14, delete "loon" and insert -- loop --, therefor.

In column 10, line 38, in Claim 14, delete "freauency" and insert -- frequency --, therefor.

In column 10, line 38, in Claim 14, delete "freguencies" and insert -- frequencies --, therefor.

In column 10, line 41, in Claim 14, delete "freguencies" and insert -- frequencies --, therefor.

In column 10, line 44, in Claim 14, delete "freauency" and insert -- frequency --, therefor.

In column 10, line 46, in Claim 14, delete "freguency" and insert -- frequency --, therefor.

In column 10, line 51, in Claim 14, delete "freguency" and insert -- frequency --, therefor.

In column 10, line 52, in Claim 14, delete "freguency" and insert -- frequency --, therefor.

In column 10, line 56, in Claim 14, delete "freguency" and insert -- frequency --, therefor.

In column 10, line 57, in Claim 14, delete "freauency" and insert -- frequency --, therefor.

In column 11, line 4, in Claim 15, delete "loon" and insert -- loop --, therefor.

In column 11, line 5, in Claim 15, delete "freguencies" and insert -- frequencies --, therefor.

In column 11, line 7, in Claim 15, delete "freguencies" and insert -- frequencies --, therefor.